United States Patent
Chen et al.

(10) Patent No.: US 10,168,375 B2
(45) Date of Patent: Jan. 1, 2019

(54) PHASE CURRENT INTEGRATION METHOD FOR DIAGNOSING FAULT IN SWITCHED RELUCTANCE MOTOR POWER CONVERTER

(71) Applicant: China University of Mining and Technology, Xuzhou (CN)

(72) Inventors: Hao Chen, Xuzhou (CN); Xing Wang, Xuzhou (CN); Shengquan Wang, Xuzhou (CN)

(73) Assignee: China University of Mining and Technology, Jiangsu (CN)

( * ) Notice: Subject to any disclaimer, the term of this patent is extended or adjusted under 35 U.S.C. 154(b) by 28 days.

(21) Appl. No.: 15/308,696

(22) PCT Filed: Jul. 1, 2015

(86) PCT No.: PCT/CN2015/083046
§ 371 (c)(1),
(2) Date: Nov. 3, 2016

(87) PCT Pub. No.: WO2015/169265
PCT Pub. Date: Nov. 12, 2015

(65) Prior Publication Data
US 2017/0192044 A1    Jul. 6, 2017

(30) Foreign Application Priority Data
May 7, 2014  (CN) .......................... 2014 1 0191712

(51) Int. Cl.
G01R 31/34    (2006.01)
G01R 31/02    (2006.01)
G01R 31/42    (2006.01)

(52) U.S. Cl.
CPC .......... *G01R 31/025* (2013.01); *G01R 31/343* (2013.01); *G01R 31/42* (2013.01); *G01R 31/024* (2013.01); *G01R 31/34* (2013.01)

(58) Field of Classification Search
CPC .... G01R 31/02; G01R 31/025; G01R 31/343; G01R 31/42; G01R 31/34; G01R 31/3277;
(Continued)

(56) References Cited

U.S. PATENT DOCUMENTS 5,493,195 A    2/1996  Heglund et al.
5,786,681 A *  7/1998  Kalpathi ............. H02P 25/0925
                                                318/254.2
(Continued)

FOREIGN PATENT DOCUMENTS

CN    101551441 A    10/2009
CN    101666858 A    3/2010
(Continued)

OTHER PUBLICATIONS

International Search Report re PCT/CN2015/083046, dated Sep. 16, 2015, 6 pgs.
(Continued)

*Primary Examiner* — Vinh Nguyen
(74) *Attorney, Agent, or Firm* — Greenberg Traurig, LLP

(57) ABSTRACT

A phase current integration method for diagnosing a fault in a switched reluctance motor power converter determines whether the main switch of a switched reluctance motor power converter is experiencing a short circuit or an open circuit fault by measuring a phase current $i_o(t)$ transient value of said converter in a non-fault state as well as a present phase current i(t) transient value of said converter, so as to obtain, by an integration operation, an integration value $S_{nO}$ of a phase current during a certain period under the
(Continued)

non-fault state, and an integration value $S_n$ of a phase current during a certain period under a present state, the ratio En of the two values indicating a fault characteristic value.

1 Claim, 3 Drawing Sheets

(58) Field of Classification Search
CPC .. H02P 25/092; H02P 29/024; H02P 29/0241; H02P 25/08; H02P 25/083; H02P 25/089; H02P 6/18; B60L 11/1807
See application file for complete search history.

(56) References Cited

U.S. PATENT DOCUMENTS

| | | | | |
|---|---|---|---|---|
| 6,066,074 | A | * | 5/2000 | Marcinkiewicz .. A63B 21/0053 482/4 |
| 9,823,307 | B2 | * | 11/2017 | Chen ................. G01R 31/42 |

FOREIGN PATENT DOCUMENTS

| CN | 101839957 A | 9/2010 |
|---|---|---|
| CN | 102081129 A | 6/2011 |
| CN | 103105559 A | 5/2013 |
| CN | 103454550 A | 12/2013 |
| CN | 103675589 A | 3/2014 |
| CN | 103941142 A | 7/2014 |
| JP | 2004289882 A | 10/2004 |

OTHER PUBLICATIONS

Lu, Shengli et al., Fault Diagnosis and Fault-Tolerant Control Strategy for Power Converter of Switched Reluctance Motor, Transactions of China Electrotechnical Society, vol. 24, No. 11, Nov. 26, 2009, pp. 199-206.

* cited by examiner

PHASE CURRENT INTEGRATION METHOD FOR DIAGNOSING FAULT IN SWITCHED RELUCTANCE MOTOR POWER CONVERTER

CROSS REFERENCE TO RELATED APPLICATION

The present application is a 371 U.S. National Stage of International Application No. PCT/CN2015/083046, filed Jul. 1, 2015, which claims the benefit of the earlier filing date of Chinese Patent Application No. 201410191712.6 filed on May 7, 2014, which are each incorporated herein by reference in their entirety.

FIELD OF THE DISCLOSURE

The present invention relates to a phase current integration method for diagnosing fault in switched reluctance motor power converter, and particularly relates to a method for diagnosing fault of master switch short circuit and open circuit in switched reluctance motor power converter with multiple phases and multiple topological structures.

BACKGROUND OF RELATED ART

Switched reluctance motor power converter fault detection and diagnosis is mainly a qualitative analysis method based on a system model. By modeling and simulation or experiment method, it analyzes and compares the change information of observed quantities of the system in normal and fault states, and extracts residual error or fault features with a view to realize fault isolation of the system by fault decision algorithm. For a system a mathematical model of which can be accurately established, this method can be used to intensively study system fault mechanism. It not only makes for feature analysis of known faults, but also may conduct performance analysis and diagnosis for the faults which have never appeared or for which the experience is inadequate, so it is widely applied. Switched reluctance motor has a double salient structure and non-sine power supply features different from a conventional AC-DC motor. Consequently, the fault isolation and fault feature extraction of switched reluctance motor power converter are different from other motors obviously. When qualitative analysis method based on system model is applied in fault diagnosis of switched reluctance motor power converters, the difficulty rests with the establishment of an accurate mathematical model for switched reluctance motor system. The fault diagnosis method with no need for an accurate mathematical model for switched reluctance motor system is one of the important directions of the current research and technical development of switched reluctance motor system.

SUMMARY

The object of the present invention is to provide a phase current integration method for diagnosing fault of master switch short circuit and open circuit in switched reluctance motor power converter to address the existing problems of the prior art.

The method for diagnosing fault of master switch short circuit in switched reluctance motor power converter in the present invention, comprising:

Detecting the transient value of phase current $i_o(t)$ of switched reluctance motor power converter in a fault-free state, and obtaining the integral value of phase current in a fault-free state in one cycle through integral operation:

$$S_{nO} = \int_T i_O(t)dt \quad (1)$$

wherein, n is the rotational speed of the motor, T is the change cycle of phase current, and t is time.

Detecting the transient value of present phase current i(t) of switched reluctance motor power converter, and obtaining the integral value of phase current in the present state in one cycle through integral operation:

$$S_n = \int_T i(t)dt \quad (2)$$

wherein, n is the rotational speed of the motor, T is the change cycle of phase current, and t is time.

The ratio $E_n = S_n/S_{nO}$ between the integral value $S_n$ of the phase current in the present state in one cycle and the integral value $S_{nO}$ of the phase current in a fault-free state in one cycle is used as fault characteristic quantity to diagnose if the master switches of switched reluctance motor power converter have a short circuit or open circuit fault.

When the curve values of the ratio $E_n = S_n/S_{nO}$ are all 1 in the whole range of rotational speed, the switched reluctance motor power converter does not have a master switch fault.

When the curve values of the ratio $E_n = S_n/S_{nO}$ are above 1.2 in the whole range of rotational speed, the switched reluctance motor power converter has a master switch short circuit fault.

When the curve values of the ratio $E_n = S_n/S_{nO}$ are 0 in the whole range of rotational speed, the switched reluctance motor power converter has a master switch open circuit fault.

The present invention is suitable for diagnosing fault of master switch short circuit and open circuit in switched reluctance motor power converter with multiple phases and multiple topological structures. The transient value of phase current $i_o(t)$ in a fault-free state and the transient value of the present phase current i(t) of switched reluctance motor power converter are detected. The ratio $E_n = S_n/S_{nO}$ between the integral value $S_n$ of the phase current in the present state in one cycle and the integral value $S_{nO}$ of the phase current in a fault-free state in one cycle is calculated and used as fault characteristic quantity. The master switch short circuit and open circuit faults of the switched reluctance motor power converter are diagnosed and the object of the present invention is achieved. The method for diagnosing fault of master switch short circuit and open circuit in switched reluctance motor power converter does not need additional hardware, has 100% of positioning accuracy rate of fault diagnosis, and shows a good engineering application value. The invention may be used in switched reluctance motor power converters having multiple phases and multiple topographies. The invention allows for accurate location of faults and has excellent engineering application value.

DETAILED DESCRIPTION

The examples of the present invention are further described below in connection with the accompanying drawings:

EXAMPLE 1

Figure 1:
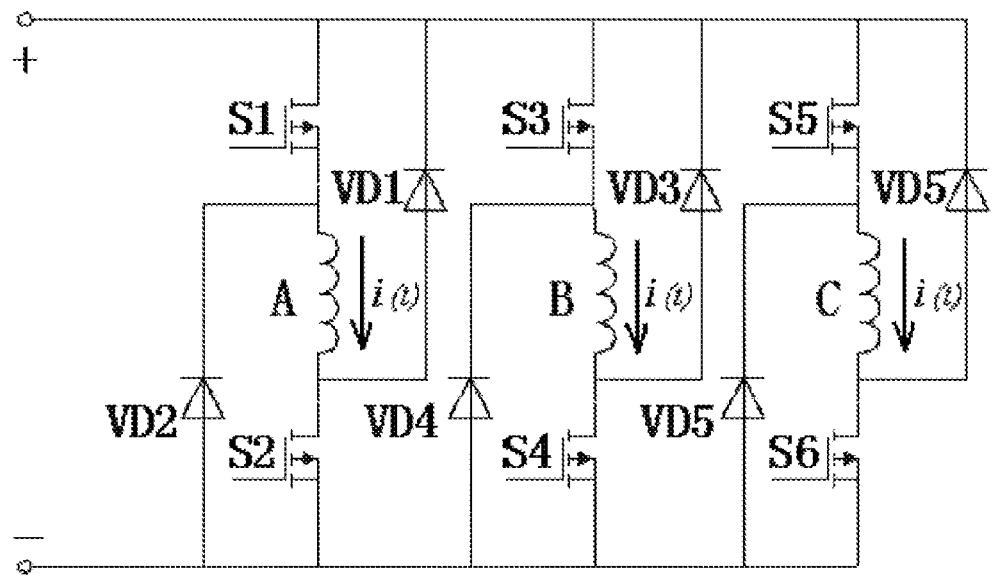
FIG. 1 is a topological structure diagram of the main circuit of a three-phase double-switch switched reluctance motor power converter in the present invention.

FIG. 1 shows the main circuit of a three-phase double-switch switched reluctance motor power converter. Each phase of the three-phase double-switch power converter has two master switches and two freewheel diodes. Phase A, phase B and phase C are connected to the anode "+" and cathode "−" of the power supply in parallel, wherein one end of phase A upper master switch S1 is connected to the anode "+" of the power supply, the other end of the upper master switch S1 is connected to one end of phase A winding, one end of the lower master switch S2 is connected to the cathode "−" of the power supply, the other end of the lower master switch S2 is connected to the other end of phase A winding, one end of the upper freewheel diode VD1 is connected to the anode "+" of the power supply, the other end of the upper freewheel diode VD1 is connected to the other end of phase A winding, one end of the lower freewheel diode VD2 is connected to the cathode "−" of the power supply, and the other end of the lower freewheel diode VD2 is connected to one end of phase A winding. The internal connection mode of phase B and phase C is the same as that of phase A, so it is omitted.

The method for diagnosing fault of master switch short circuit and open circuit in switched reluctance motor power converter is as follows.

Firstly, detecting the transient value of phase A current $i_o(t)$ of three-phase double-switch switched reluctance motor power converter in a fault-free state, and obtaining the integral value of phase A current in a fault-free state in one cycle through integral operation:

$$S_{nO} = \int_T i_O(t)dt \qquad (1)$$

wherein, n is the rotational speed of the motor, T is the change cycle of phase current, and t is time.

Detecting the transient value of present phase A current i(t) of the three-phase double-switch switched reluctance motor power converter, and obtaining the integral value of phase A current in the present state in one cycle through integral operation:

$$S_n = \int_T i(t)dt \qquad (2)$$

wherein, n is the rotational speed of the motor, T is the change cycle of phase current, and t is time.

The ratio $E_n = S_n/S_{nO}$ between the integral value $S_n$ of the phase A current in the present state in one cycle and the integral value $S_{nO}$ of the phase A current in a fault-free state in one cycle is used as fault characteristic quantity to diagnose if the phase A master switches of the switched reluctance motor power converter have a short circuit or open circuit fault.

Figure 2:
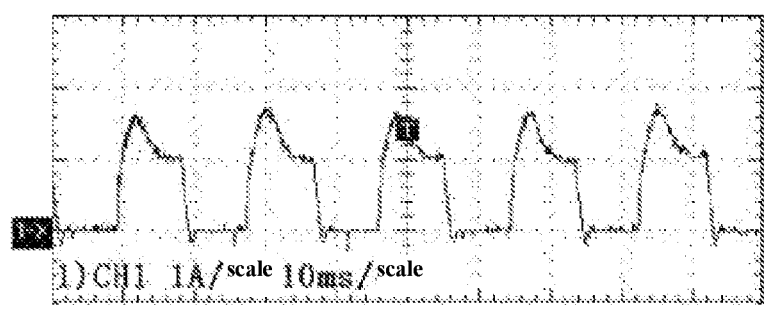
FIG. 2 is a phase current oscillogram of a three-phase double-switch switched reluctance motor power converter in the present invention, without a master switch fault.

FIG. 2 shows phase current waveform. When the curve values of the ratio $E_n = S_n/S_{nO}$ are all 1 in the whole range of rotational speed as shown in FIG. 3, the phase A of switched reluctance motor power converter does not have a master switch fault.

Figure 3:
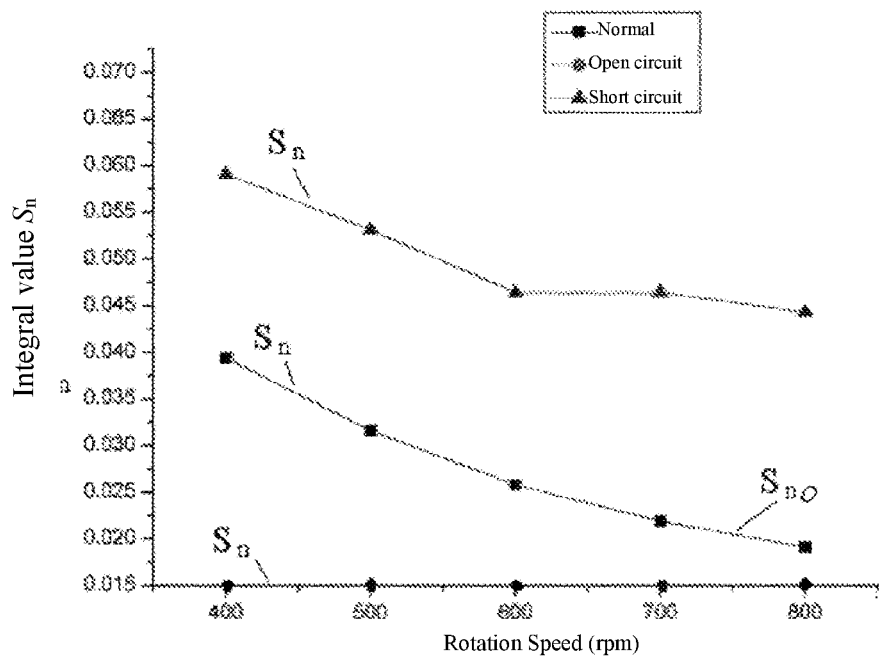
FIG. 3 is an integral value curve of phase current in a whole range of rotational speed in one cycle in the present invention.
Figure 4:
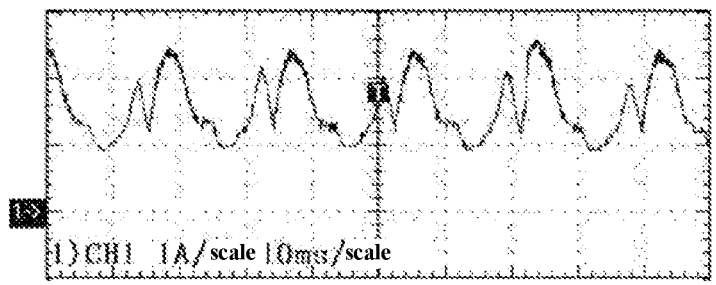
FIG. 4 is a phase current oscillogram of a three-phase double-switch switched reluctance motor power converter in the present invention, with a master switch short circuit fault.

As shown in FIG. 3, when the curve values of the ratio $E_n = S_n/S_{nO}$ are above 1.2 in the whole range of rotational speed, phase A of the switched reluctance motor power converter has a master switch short circuit fault. Its phase current waveform is shown in FIG. 4.

Figure 5:
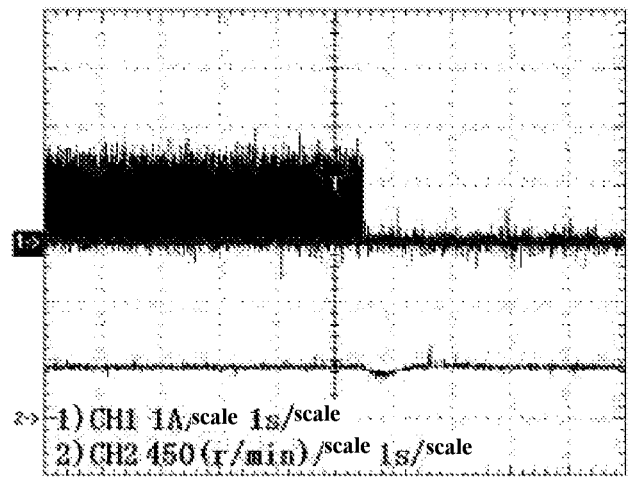
FIG. 5 is a phase current oscillogram of a three-phase double-switch switched reluctance motor power converter in the present invention, with a master switch open circuit fault.

As shown in FIG. 3, when the curve values of the ratio $E_n = S_n/S_{nO}$ are 0 in the whole range of rotational speed, phase A of the switched reluctance motor power converter has a master switch open circuit fault. Its phase current waveform is shown in FIG. 5.

Then, detecting the transient value of phase B current $i_o(t)$ of three-phase double-switch switched reluctance motor power converter in a fault-free state, and obtaining the integral value of phase B current in a fault-free state in one cycle through integral operation:

$$S_{nO} = \int_T i_O(t)dt \qquad (1)$$

wherein, n is the rotational speed of the motor, T is the change cycle of phase current, and t is time.

Detecting the transient value of present phase B current i(t) of the three-phase double-switch switched reluctance motor power converter, and obtaining the integral value of phase B current in the present state in one cycle through integral operation:

$$S_n = \int_T i(t)dt \qquad (2)$$

wherein, n is the rotational speed of the motor, T is the change cycle of phase current, and t is time.

The ratio $E_n = S_n/S_{nO}$ between the integral value $S_n$ of the phase B current in the present state in one cycle and the integral value $S_{nO}$ of the phase B current in a fault-free state in one cycle is used as fault characteristic quantity to diagnose if the phase B master switches of the switched reluctance motor power converter have a short circuit or open circuit fault. FIG. 2 shows phase current waveform. When the curve values of the ratio $E_n = S_n/S_{nO}$ are all 1 in the whole range of rotational speed as shown in FIG. 3, the phase B of switched reluctance motor power converter does not have a master switch fault. As shown in FIG. 3, when the curve values of the ratio $E_n=S_n/S_{nO}$ are above 1.2 in the whole range of rotational speed, phase B of the switched reluctance motor power converter has a master switch short circuit fault. Its phase current waveform is shown in FIG. 4. As shown in FIG. 3, when the curve values of the ratio $E_n=S_n/S_{nO}$ are 0 in the whole range of rotational speed, phase B of the switched reluctance motor power converter has a master switch open circuit fault. Its phase current waveform is shown in FIG. 5.

Lastly, detecting the transient value of phase C current $i_o(t)$ of three-phase double-switch switched reluctance motor power converter in a fault-free state, and obtaining the integral value of phase C current in a fault-free state in one cycle through integral operation:

$$S_{nO} = \int_T i_O(t)dt \qquad (1)$$

wherein, n is the rotational speed of the motor, T is the change cycle of phase current, and t is time.

Detecting the transient value of present phase C current $i(t)$ of the three-phase double-switch switched reluctance motor power converter, and obtaining the integral value of phase C current in the present state in one cycle through integral operation:

$$S_n = \int_T i(t)dt \qquad (2)$$

wherein, n is the rotational speed of the motor, T is the change cycle of phase current, and t is time.

The ratio $E_n=S_n/S_{nO}$ between the integral value $S_n$ of the phase C current in the present state in one cycle and the integral value $S_{nO}$ of the phase C current in a fault-free state in one cycle is used as fault characteristic quantity to diagnose if the phase C master switches of the switched reluctance motor power converter have a short circuit or open circuit fault.

FIG. 2 shows phase current waveform. When the curve values of the ratio $E_n=S_n/S_{nO}$ are all 1 in the whole range of rotational speed as shown in FIG. 3, the phase C of switched reluctance motor power converter does not have a master switch fault.

As shown in FIG. 3, when the curve values of the ratio $E_n=S_n/S_{nO}$ are above 1.2 in the whole range of rotational speed, phase C of the switched reluctance motor power converter has a master switch short circuit fault. Its phase current waveform is shown in FIG. 4.

As shown in FIG. 3, when the curve values of the ratio $E_n=S_n/S_{nO}$ are 0 in the whole range of rotational speed, phase C of the switched reluctance motor power converter has a master switch open circuit fault. Its phase current waveform is shown in FIG. 5.

When two or more phases of this switched reluctance motor power converter have master switch short circuit or open circuit fault in the same time, the fault detection, fault type identification and fault phase positioning methods are similar to the above.

The positioning of fault phase with master switch short circuit or open circuit is realized through detecting the phase currents of phases A, B and C respectively, obtaining the ratio $E_n=S_n/S_{nO}$ between the integral value $S_n$ of the phase current in the present state in one cycle and the integral value $S_{nO}$ of the phase current in a fault-free state in one cycle and judging the curve value of the ratio $E_n=S_n/S_{nO}$ in the whole range of rotational speed (equal to 1, above 1.2 or equal to 0).

EXAMPLE 2

Figure 6:
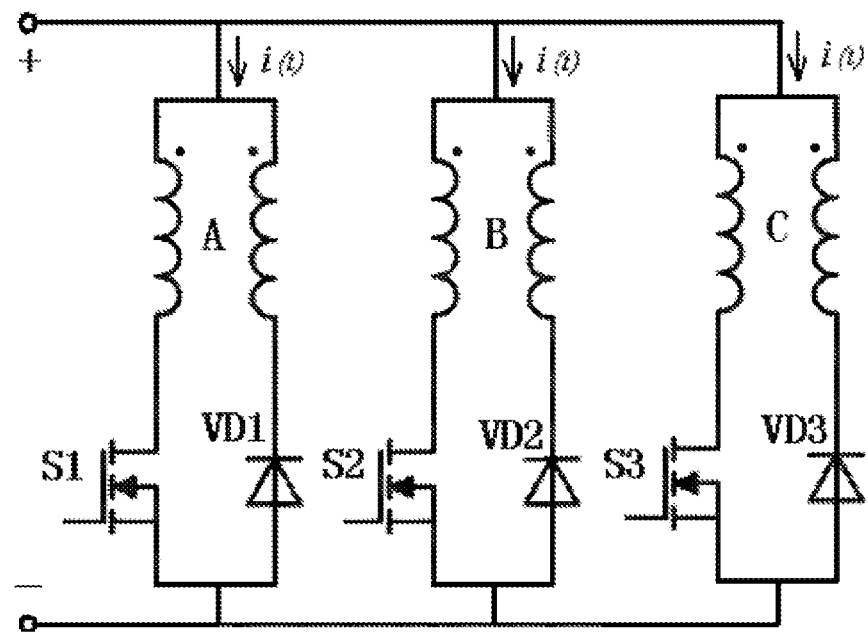
FIG. 6 is a topological structure diagram of the main circuit of a three-phase duplex winding switched reluctance motor power converter provided by the present invention.

FIG. 6 shows the main circuit of a three-phase duplex winding switched reluctance motor power converter. Each phase of the three-phase duplex winding power converter has one master switch and one freewheel diode. Phase A, phase B and phase C are connected to the anode "+" and cathode "−" of the power supply in parallel. Each phase of the three-phase duplex winding power converter has two windings. The primary winding and the secondary winding are wound in two wires in parallel, with reverse connection of dotted terminals. One end of phase A master switch S1 is connected to the cathode "−" of the power supply, the other end of the master switch S1 is connected to one end of the phase A primary winding, the other end of phase A primary winding is connected to anode "+" of the power supply, one end of freewheel diode VD1 is connected to cathode "−" of the power supply, the other end of freewheel diode VD1 is connected to one end of phase A secondary winding, and the other end of phase A secondary winding is connected to the anode "+" of the power supply.

The internal connection mode of phase B and phase C is the same as that of phase A, so it is omitted. The method for diagnosing the master switch short circuit and open circuit faults of switched reluctance motor power converter is as follows:

Firstly, detecting the transient value of phase A current $i_o(t)$ of three-phase duplex winding switched reluctance motor power converter in a fault-free state, and obtaining the integral value of phase A current in a fault-free state in one cycle through integral operation:

$$S_{nO} = \int_T i_O(t)dt \qquad (1)$$

wherein, n is the rotational speed of the motor, T is the change cycle of phase current, and t is time.

Detecting the transient value of present phase A current $i(t)$ of the three-phase duplex winding switched reluctance motor power converter, and obtaining the integral value of phase A current in the present state in one cycle through integral operation:

$$S_n = \int_T i(t)dt \qquad (2)$$

wherein, n is the rotational speed of the motor, T is the change cycle of phase current, and t is time.

The ratio $E_n=S_n/S_{nO}$ between the integral value $S_n$ of the phase A current in the present state in one cycle and the integral value $S_{nO}$ of the phase A current in a fault-free state in one cycle is used as fault characteristic quantity to diagnose if the phase A master switches of the switched reluctance motor power converter have a short circuit or open circuit fault.

FIG. 2 shows phase current waveform. When the curve values of the ratio $E_n=S_n/S_{nO}$ are all 1 in the whole range of rotational speed as shown in FIG. 3, the phase A of switched reluctance motor power converter does not have a master switch fault.

As shown in FIG. 3, when the curve values of the ratio $E_n=S_n/S_{nO}$ are above 1.2 in the whole range of rotational speed, phase A of the switched reluctance motor power converter has a master switch short circuit fault. Its phase current waveform is shown in FIG. 4.

As shown in FIG. 3, when the curve values of the ratio $E_n=S_n/S_{nO}$ are 0 in the whole range of rotational speed, phase A of the switched reluctance motor power converter has a master switch open circuit fault. Its phase current waveform is shown in FIG. 5.

Then, detecting the transient value of phase B current $i_o(t)$ of three-phase duplex winding switched reluctance motor power converter in a fault-free state, and obtaining the integral value of phase B current in a fault-free state in one cycle through integral operation:

$$S_{nO} = \int_T i_O(t)dt \qquad (1)$$

wherein, n is the rotational speed of the motor, T is the change cycle of phase current, and t is time.

Detecting the transient value of present phase B current i(t) of the three-phase duplex winding switched reluctance motor power converter, and obtaining the integral value of phase B current in the present state in one cycle through integral operation:

$$S_n = \int_T i(t)dt \qquad (2)$$

wherein, n is the rotational speed of the motor, T is the change cycle of phase current, and t is time.

The ratio $E_n=S_n/S_{nO}$ between the integral value $S_n$ of the phase B current in the present state in one cycle and the integral value $S_{nO}$ of the phase B current in a fault-free state in one cycle is used as fault characteristic quantity to diagnose if the phase B master switches of the switched reluctance motor power converter have a short circuit or open circuit fault.

FIG. 2 shows phase current waveform. When the curve values of the ratio $E_n=S_n/S_{nO}$ are all 1 in the whole range of rotational speed as shown in FIG. 3, the phase B of switched reluctance motor power converter does not have a master switch fault.

As shown in FIG. 3, when the curve values of the ratio $E_n=S_n/S_{nO}$ are above 1.2 in the whole range of rotational speed, phase B of the switched reluctance motor power converter has a master switch short circuit fault. Its phase current waveform is shown in FIG. 4.

As shown in FIG. 3, when the curve values of the ratio $E_n=S_n/S_{nO}$ are 0 in the whole range of rotational speed, phase B of the switched reluctance motor power converter has a master switch open circuit fault. Its phase current waveform is shown in FIG. 5.

Lastly, detecting the transient value of phase C current $i_o(t)$ of three-phase duplex winding switched reluctance motor power converter in a fault-free state, and obtaining the integral value of phase C current in a fault-free state in one cycle through integral operation:

$$S_{nO} = \int_T i_O(t)dt \qquad (1)$$

wherein, n is the rotational speed of the motor, T is the change cycle of phase current, and t is time.

Detecting the transient value of present phase C current i(t) of the three-phase duplex winding switched reluctance motor power converter, and obtaining the integral value of phase C current in the present state in one cycle through integral operation:

$$S_n = \int_T i(t)dt \qquad (2)$$

wherein, n is the rotational speed of the motor, T is the change cycle of phase current, and t is time.

The ratio $E_n=S_n/S_{nO}$ between the integral value $S_n$ of the phase C current in the present state in one cycle and the integral value $S_{nO}$ of the phase C current in a fault-free state in one cycle is used as fault characteristic quantity to diagnose if the phase C master switches of the switched reluctance motor power converter have a short circuit or open circuit fault.

FIG. 2 shows phase current waveform. When the curve values of the ratio $E_n=S_n/S_{nO}$ are all 1 in the whole range of rotational speed as shown in FIG. 3, the phase C of switched reluctance motor power converter does not have a master switch fault.

As shown in FIG. 3, when the curve values of the ratio $E_n=S_n/S_{nO}$ are above 1.2 in the whole range of rotational speed, phase C of the switched reluctance motor power converter has a master switch short circuit fault. Its phase current waveform is shown in FIG. 4.

As shown in FIG. 3, when the curve values of the ratio $E_n=S_n/S_{nO}$ are 0 in the whole range of rotational speed, phase C of the switched reluctance motor power converter has a master switch open circuit fault. Its phase current waveform is shown in FIG. 5.

When two or more phases of this duplex winding switched reluctance motor power converter have master switch short circuit or open circuit fault in the same time, the fault detection, fault type identification and fault phase positioning methods are similar to the above.

The positioning of fault phase with master switch short circuit or open circuit is realized through detecting the phase currents of phases A, B and C respectively, obtaining the ratio $E_n=S_n/S_{nO}$ between the integral value $S_n$ of the phase current in the present state in one cycle and the integral value $S_{nO}$ of the phase current in a fault-free state in one cycle and judging the curve value of the ratio $E_n=S_n/S_{nO}$ in the whole range of rotational speed (equal to 1, above 1.2 or equal to 0).

We claim:

1. A phase current integration method for diagnosing fault in switched reluctance motor power converter, the method comprising:
   detecting the transient value of phase current $i_o(t)$ of switched reluctance motor power converter in a fault-free state, and obtaining the integral value of phase current in a fault-free state in one cycle through an integral operation according to the equation $S_{nO}=\int_T i_O(t)dt$, wherein n is the rotational speed of the motor, T is the change cycle of phase current, and t is time;

detecting the transient value of present phase current i(t) of switched reluctance motor power converter, and obtaining the integral value of phase current in the present state in one cycle through integral operation according to the equation $S_n = \int_T i(t)dt$, wherein, n is the rotational speed of the motor, T is the change cycle of phase current, and t is time;

the ratio $E_n = S_n/S_{nO}$ between the integral value $S_n$ of the phase current in the present state in one cycle and the integral value $S_{nO}$ of the phase current in a fault-free state in one cycle is used as fault characteristic quantity to diagnose if the master switches of switched reluctance motor power converter have a short circuit or open circuit fault;

when the curve values of the ratio $E_n = S_n/S_{nO}$ are all 1 in the whole range of rotational speed, the switched reluctance motor power converter does not have a master switch fault;

when the curve values of the ratio $E_n = S_n/S_{nO}$ are above 1.2 in the whole range of rotational speed, the switched reluctance motor power converter has a master switch short circuit fault;

when the curve values of the ratio $E_n = S_n/S_{nO}$ are 0 in the whole range of rotational speed, the switched reluctance motor power converter has a master switch open circuit fault;

the positioning of fault phase with master switch short circuit or open circuit is realized through detecting phase current, obtaining the ratio $E_n = S_n/S_{nO}$ between the integral value $S_n$ of the phase current in the present state in one cycle and the integral value $S_{nO}$ of the phase current in a fault-free state in one cycle and judging whether the curve value of the ratio $E_n = S_n/S_{nO}$ in the whole range of rotational speed is equal to 1, above 1.2 or equal to 0.

* * * * *